United States Patent [19]
Xue

[11] Patent Number: 5,748,044
[45] Date of Patent: May 5, 1998

[54] DUAL VCO PHASE-LOCKED LOOP

[75] Inventor: Yuan Xue, Fremont, Calif.

[73] Assignee: Silicon Motion, Inc., San Jose, Calif.

[21] Appl. No.: 731,242

[22] Filed: Oct. 11, 1996

[51] Int. Cl.$^6$ .............................. H03L 7/08; G09G 5/12
[52] U.S. Cl. ...................... 331/2; 331/8; 331/10; 331/16; 331/17; 331/25; 345/3; 348/537
[58] Field of Search .................. 331/2, 8, 10, 16, 331/17, 25; 345/3; 348/537

[56] References Cited

U.S. PATENT DOCUMENTS

| | | | |
|---|---|---|---|
| 4,567,448 | 1/1986 | Ikeda | 331/17 |
| 4,904,955 | 2/1990 | Ley | 331/25 |

OTHER PUBLICATIONS

Product Data Book, *86CM65 Aurora64V+ Dual Display Accelerator*, Section 11: Flat Panel Interface, S3 Incorporated, Santa Clara, California (Jul. 1996) pp. 1–14.

*Primary Examiner*—Siegfried H. Grimm
*Attorney, Agent, or Firm*—Hopkins & Carley

[57] ABSTRACT

A dual VCO phase-locked loop in which one VCO forms part of a standard phase-locked loop, the VCO being controlled by a loop control voltage and its output being divided and compared with an input reference signal for maintaining lock. A second VCO is indirectly controlled by the loop control voltage and tracks the output of the first VCO within ±5% over combined variations in power supply voltage from 3.0 V to 3.6 V, in ambient temperature from 20° C. to approximately 125° C., and in manufacturing process variations over 5 process corners (typical, fast-fast, slow-slow, slow-fast and fast-slow). A control current is developed for the VCO forming part of the closed loop and is coupled to the second VCO using a current mirror. An offset current is combined at the second VCO with the coupled control current. The offset current is intentionally made a compensating function of the variations in power supply voltage, ambient temperature and manufacturing process.

10 Claims, 6 Drawing Sheets

DUAL VCO PHASE-LOCKED LOOP

BACKGROUND

1. Field of the Invention

The invention relates to phase-locked loops and in particular to a phase-locked loop which includes two VCO's for generating two output signals having different frequencies.

2. Background of the Invention

In a single chip multimedia controller it is necessary to provide a pair of clock signals, each related to the refresh rates of common display devices. For example, the controller will provide a clock related to the refresh rate of an NTSC color TV signal and also a clock related to the refresh rate of a DSTN color LCD display.

In the prior art, as illustrated in FIG. 1, the two clock signals are provided by a pair 10 of independent phase-locked loops, 12, 14 respectively, receiving a common reference signal ("$f_i$"). Each loop includes a phase-frequency detector ("PFD"), a charge pump, a loop filter ("LF"), and produces a control voltage ("$V_{CNT}$") which determines the output frequency of a voltage-controlled oscillator ("VCO") at an output clock signal ("$f_o$"). The frequency of each output clock signal $f_o$ is reduced by a loop divider circuit ("1/N") and fed back to a second input of the phase-frequency detector for locking the output clock signal $f_o$ to the input signal $f_i$. The prior art circuit of FIG. 1 operates successfully, but requires two complete phase-locked loops.

In a single chip multimedia controller the need to implement two complete phase-locked loops increases substantially the chip area and operating power required. It would be desirable to provide a phase-locked loop able to supply the two output frequencies at a fraction of the area and power required for the prior art implementation of FIG. 1.

SUMMARY OF THE INVENTION

The present invention provides a solution to the above problem by using a single phase-locked loop in which a loop control voltage controls the output frequency of two voltage-controlled oscillators, each oscillator supplying one of the desired output clock signals. The output of one oscillator is fed back through a divider circuit in a standard phase-locked loop configuration to a phase-frequency detector which compares the divided-down output clock signal with a reference input signal. The loop locks the output of the first oscillator to the phase of the reference signal. The output of the other VCO is not fed back in a closed loop.

The first VCO includes a frequency control circuit which receives the loop control voltage and controls the frequency and phase of the first oscillator. The frequency control circuit also provides a control signal to an auxiliary frequency control circuit which controls the frequency of the second oscillator.

Features and Advantages

The frequency control and the auxiliary frequency control circuits permit a frequency control current for the second voltage-controlled oscillator to be made a function of the operating temperature, the power supply voltage and the chip manufacturing process variation in addition to the loop control voltage. As a result, the frequency of the second voltage-controlled oscillator is virtually independent of the ambient temperature, operating voltage and manufacturing process variations.

Simulations of the present invention show that the frequency variation of the second output clock signal is limited within a range of ±5% for a combined temperature, power supply voltage, and manufacturing process variation of 20° C. to 125° C., 3.0 V to 3.6 V, and for 5 process corners (typical, fast-fast, slow-slow, slow-fast and fast-slow).

BRIEF DESCRIPTION OF THE DRAWINGS

For a further understanding of the objects, features and advantages of the present invention, reference should be had to the following description of the preferred embodiment, taken in conjunction with the accompanying drawing, in which like parts are given like reference numerals and wherein.

DESCRIPTION OF THE PREFERRED EMBODIMENT

Figure 1:
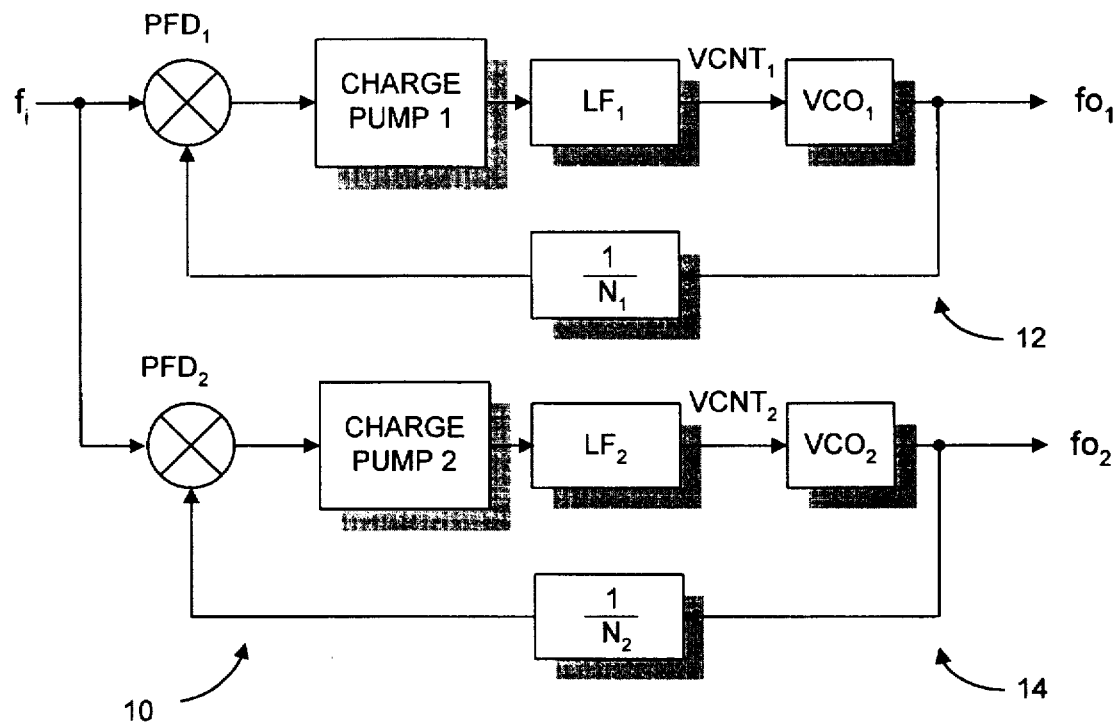
FIG. 1 is a block diagram illustrating a prior art apparatus having separate phase-locked loops tracking a single input signal.
Figure 2:
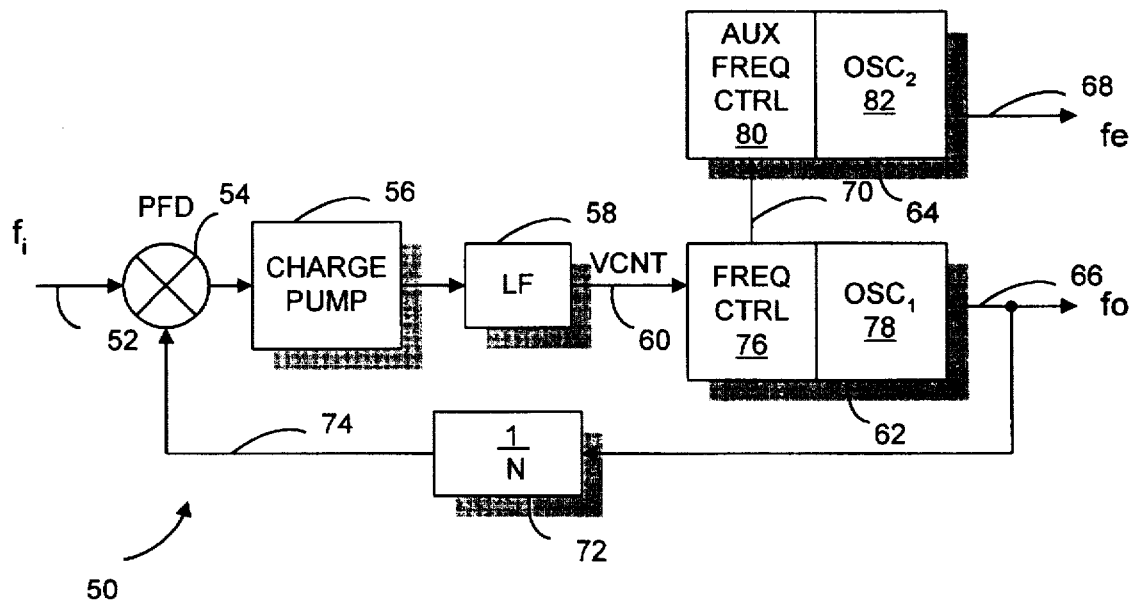
FIG. 2 is a block diagram illustrating the present invention.

A preferred embodiment of the present invention is illustrated in the block diagram of FIG. 2 in which a dual VCO phase-locked loop is designated generally by the numeral 50. The dual VCO phase-locked loop 50 (referred to hereafter alternatively as the "dual oscillator loop 50" and the "loop 50") includes a line 52 for receiving a reference input signal $f_i$, a phase-frequency detector 54, a charge pump 56, a loop filter 58, providing a loop control voltage $V_{CNT}$ on line 60, a first VCO 62 including a frequency control circuit 76 and an oscillator 78, the first oscillator providing an output clock signal $f_o$ on line 66, a second VCO 64 including an auxiliary frequency control circuit 80 and a second oscillator 82 providing a second output clock signal $f_c$ on line 68, and a divider circuit 72.

As is a common practice in the electronics field, a signal and a line carrying the signal will alternatively be referred to by the same identifying numeral. For example, in FIG. 2 the loop control voltage signal $V_{CNT}$ 60 and the line 60 carrying the signal $V_{CNT}$ will be used as appropriate. A distinction between the signal and the line carrying the signal will be made when necessary for clarity.

The phase-frequency detector 54 of the loop 50 compares the reference input signal $f_i$ 52 with the output 74 of the divider circuit 72 and uses the result of the comparison to control the loop charge pump 56. The charge pump 56 provides an output signal which is passed through the loop filter 58 to provide the loop control voltage $V_{CNT}$ 60. The control voltage 60 controls the phase and frequency of the first voltage-controlled oscillator 62. The oscillator 62 provides a clock output signal $f_o$ 66 which is divided by the divider circuit 72 and fed back to the phase-frequency detector 54 for locking the phase of the output signal $f_o$ 66 to the phase of the reference signal $f_i$ 52.

The frequency control circuit 76 supplies an output signal 70 to the second voltage-controlled oscillator 64. The signal 70 is received by the auxiliary frequency control circuit 80 and is used to control the frequency of the second oscillator 82.

Figure 3:
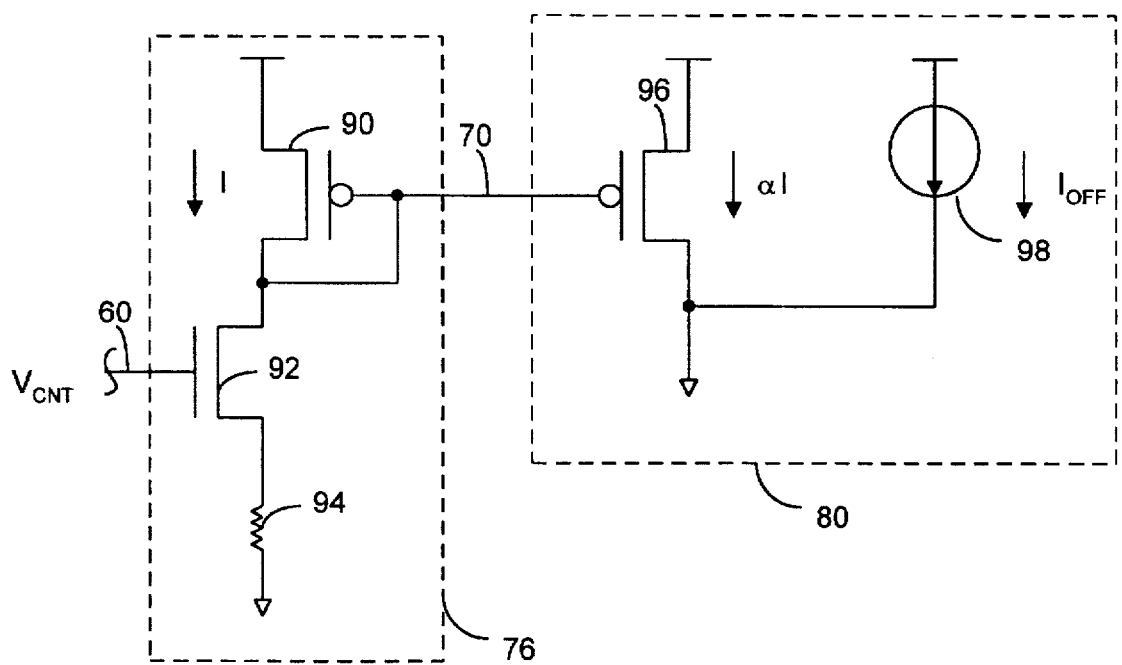
FIG. 3 is a partial schematic diagram showing a portion of the control circuits of the dual VCO phase-locked loop of FIG. 2.

Important details of the frequency control circuit 76 and the auxiliary control circuit 80 are shown in FIG. 3 which is a partial schematic diagram. A portion of the frequency control circuit 76 of FIG. 2 is shown enclosed by a broken line at the left side of FIG. 3, while a portion of the auxiliary frequency control circuit 80 of FIG. 2 is shown enclosed by a broken line at the right side of FIG. 3. The line 70 is shown connecting the circuit 76 and the circuit 80.

The frequency control circuit 76 includes a P-type CMOS transistor 90, an N-type CMOS transistor 92, and a resistor 94. The auxiliary frequency control circuit 80 includes a P-type CMOS transistor 96 and a current source 98 which represents an offset current $I_{OFF}$. The line 70 connects the gates of the transistors 90 and 96 which operate as a current mirror. The loop control voltage $V_{CNT}$ 60 controls a current I flowing through the transistor 90, and therefore through the connection 70 the loop control voltage $V_{CNT}$ 60 controls a corresponding current $\alpha I$ flowing through the transistor 96. The currents $\alpha I$ and $I_{OFF}$ control the frequency of the second oscillator 82 (FIG. 2).

The frequency of the first oscillator 78 is a function of a current I flowing through the transistor 90. The frequency of the first oscillator 78 is thus expressed as f(I), and the accuracy of f(I) is controlled by the phase-locked loop 50. The frequency of the second oscillator 82 is proportional to the square-root of the sum of the two currents $\alpha I$ and $I_{OFF}$. When $I_{OFF} \ll \alpha I$, the frequency of the second oscillator 82, $f(\alpha I + I_{OFF}) \cong f(\alpha I) + \frac{1}{2} f(I_{OFF})$. The accuracy of the term $f(\alpha I)$ is also controlled by the phase-locked loop 50 by the coupling between the transistors 90 and 96 across line 70, while the term $\frac{1}{2} f(I_{OFF})$ is a function of the semiconductor process variation, the power supply variation and the ambient temperature variation.

In the present invention, $I_{OFF}$ is intentionally made a function of temperature T, power supply voltage $V_{CC}$ and process variations P in such a way that $f(I_{OFF})$ is virtually independent of variations in these parameters.

Figure 4:
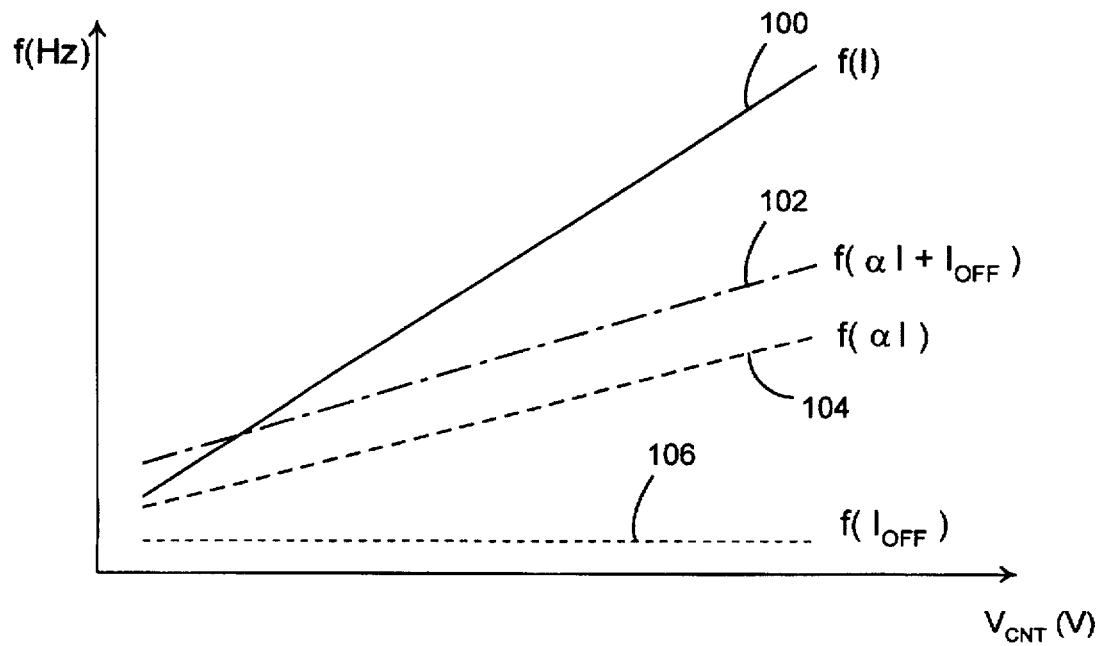
FIG. 4 is a graph showing open loop frequency versus control voltage relationships for the dual VCO phase-locked loop of FIG. 2.

FIG. 4 is a graph of frequency versus the loop control voltage $V_{CNT}$. The graph illustrates relationships between the loop control voltage $V_{CNT}$ and f(I) 100, $f(\alpha I + I_{OFF})$ 102, $f(\alpha I)$ 104, and $f(I_{OFF})$ 106. The frequency response of the first voltage-controlled oscillator 78 is represented by the curve f(I) 100, and is seen to be a linear function of the control voltage $V_{CNT}$.

FIG. 4 shows that the frequency response of the second voltage-controlled oscillator 82 includes two components: $f(\alpha I)$ 104 which is coupled via the current mirror of FIG. 3, and $f(I_{OFF})$ 106, a component intentionally created to make a constant term for the generalized linear function $f(\alpha I + I_{OFF}) = f(\alpha I) + f(I_{OFF})$. FIG. 4 also illustrates that the open loop behavior is linear and that the separate effects of $\alpha I$ and $I_{OFF}$ can be linearly combined, as shown in the curve $f(\alpha I + I_{OFF})$ 102, to predict the behavior of the second voltage-controlled oscillator 82. The dependency of $I_{OFF}$ on T, $V_{CC}$ and P is intentionally selected to compensate for variations in these parameters with the result that $f(I_{OFF})$ remains essentially flat as seen in the curve 106 of FIG. 4.

Figure 5:
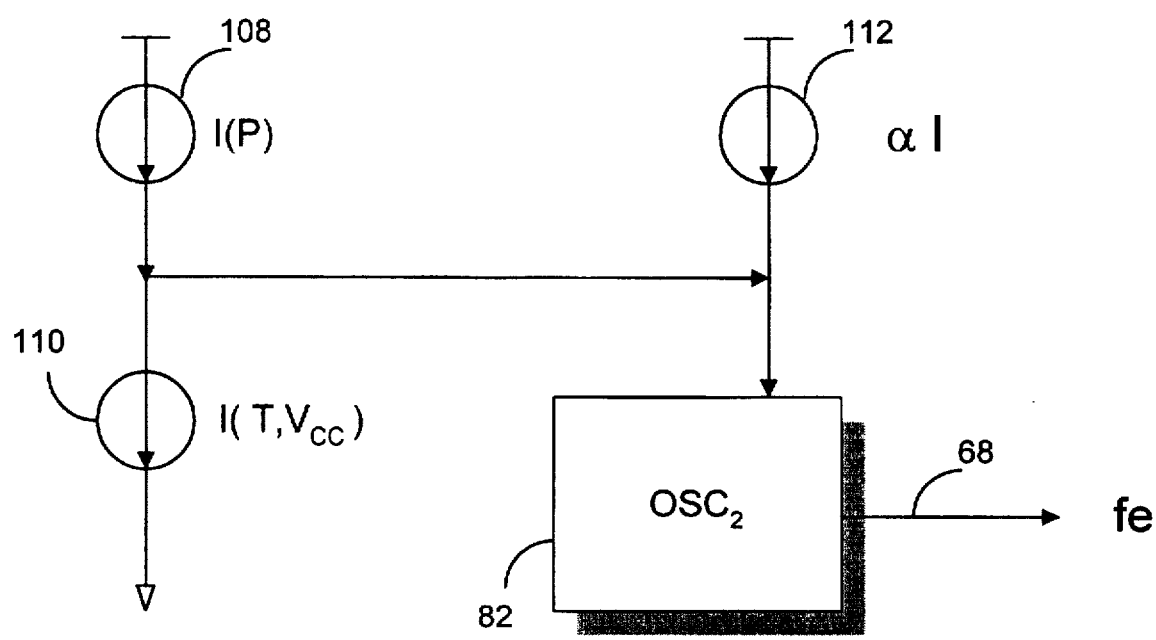
FIG. 5 is a partial block diagram showing current sources and sink for control of the second VCO of the dual VCO phase-locked loop of FIG. 2.

The creation of an $I_{OFF}$ which has the desired characteristics is illustrated in FIGS. 5–10. FIG. 5 is a block diagram which illustrates the components of the composite current which determines the frequency of the output signal $f_e$ 68 of the second oscillator 82. The current components include the offset current $I_{OFF}$ (FIG. 3) and $\alpha I$ 112. The offset current component $I_{OFF}$ is composed of two sub-components, the first being a current source I(P) 108, and the second being a current sink I(T, $V_{CC}$) 110. The sub-component I(P) 108 is intentionally made a function of the manufacturing process variations, and essentially is independent of variations in ambient temperature and power supply voltage. The sub-component I(T, $V_{CC}$) 110 is intentionally made a function of ambient temperature variation and power supply variation, and is virtually independent of variations in the manufacturing process.

Figure 6:
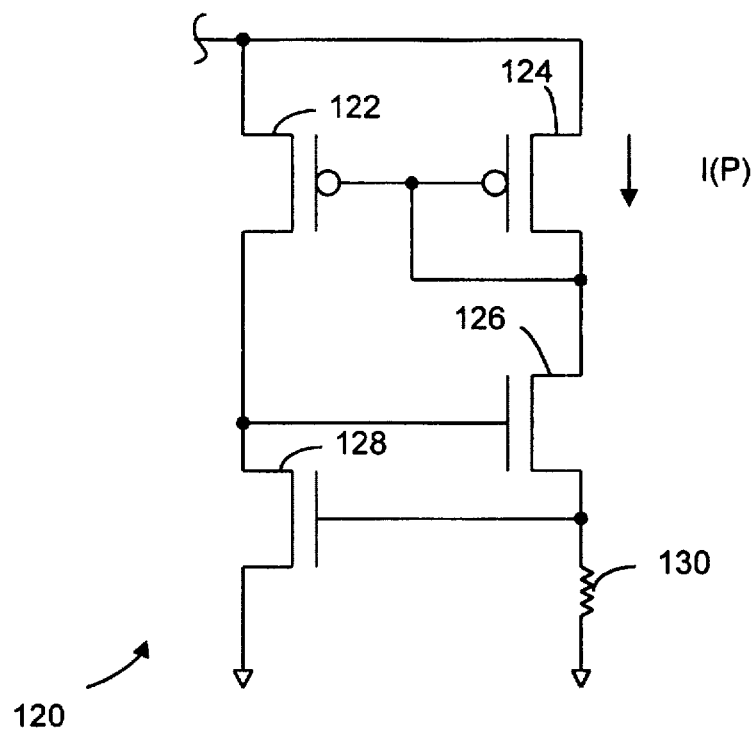
FIG. 6 is a partial schematic diagram of a current source which compensates for variations in temperature and voltage.

FIG. 6 is a partial schematic diagram illustrating a circuit 120 for providing the current source I(P) which is independent of variations in the ambient temperature and the power supply voltage. The circuit 120 includes a current mirror having interconnected P-type CMOS transistors 122, 124, a negative-feedback circuit having interconnected N-type CMOS transistors 126, 128 and a resistor 130.

Figure 7:
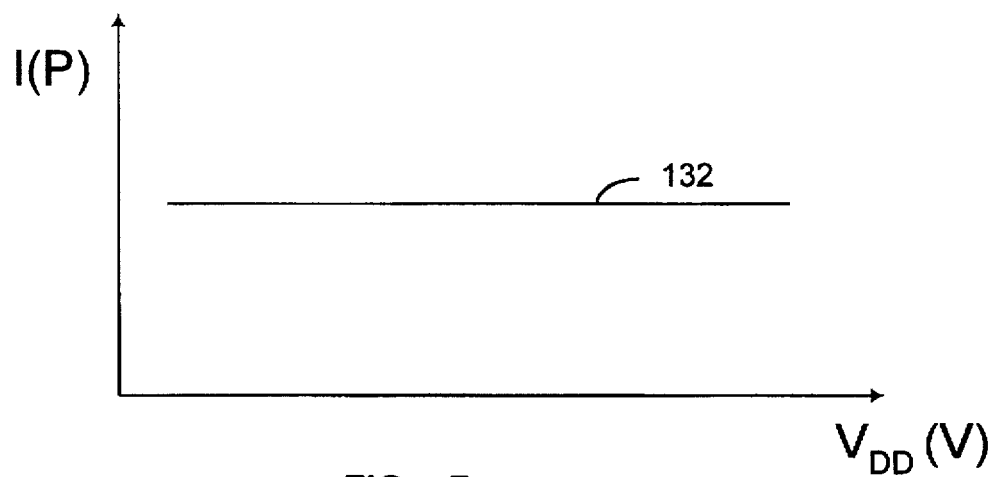
FIG. 7 is a graph illustrating the effect of the circuit shown in FIG. 6 for variations in power supply voltage.

FIG. 7 is a graph of the current I(P) versus the power supply voltage $V_{DD}$. The current I(P) 132 remains essentially constant as the power supply voltage $V_{DD}$ is varied over a range from approximately 3.0 V to 3.6 V.

Figure 8:
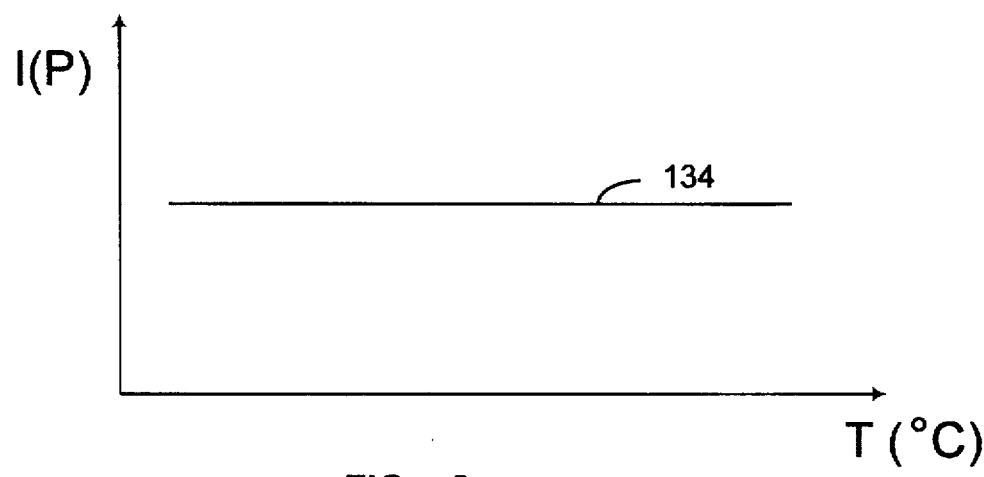
FIG. 8 is a graph illustrating the effect of the circuit shown in FIG. 6 for variations in ambient temperature.

FIG. 8 is a graph of the current I(P) versus the ambient temperature T. The current I(P) 134 remains essentially constant as the ambient temperature T is varied over a range from approximately 20° C. to approximately 125° C.

Figure 9:
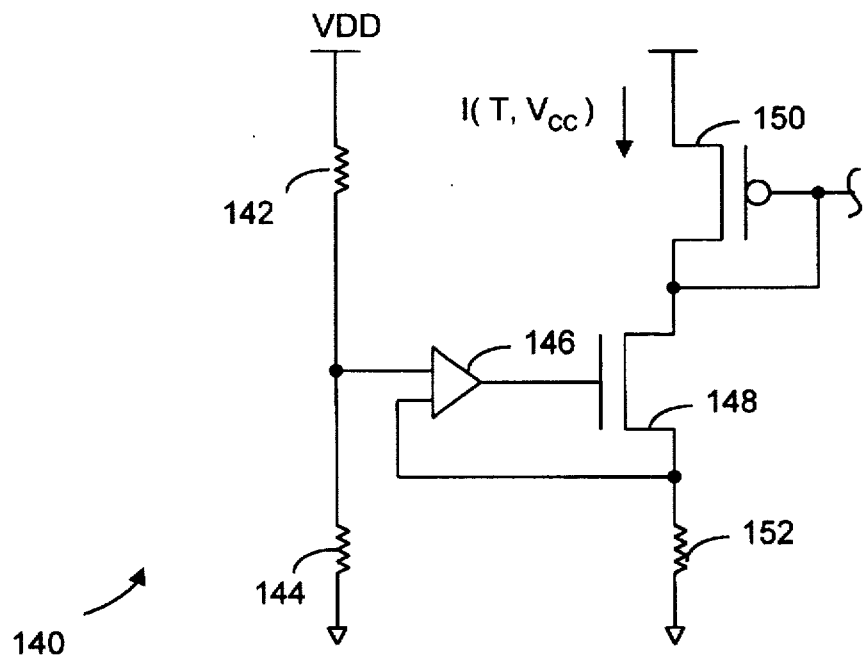
FIG. 9 is a partial schematic diagram of a current source which compensates for variations in manufacturing process variations.

FIG. 9 is a partial schematic diagram which illustrates a circuit 140 for providing the current I(T, $V_{CC}$), which is independent of variations in manufacturing process. The circuit 140 includes resistors 142, 144 forming a voltage divider and driving an operational amplifier 146 connected to the gate of an N-type CMOS transistor 148. A feedback signal to the operational amplifier 146 is developed across a resistor 152. A P-type CMOS transistor 150 forms one half of a current mirror and is used for coupling the current I(T, $V_{CC}$) through a series of current mirrors (not shown) to its location as a current sink at the control input to the second voltage-controlled oscillator 82 of FIG. 5.

Figure 10:
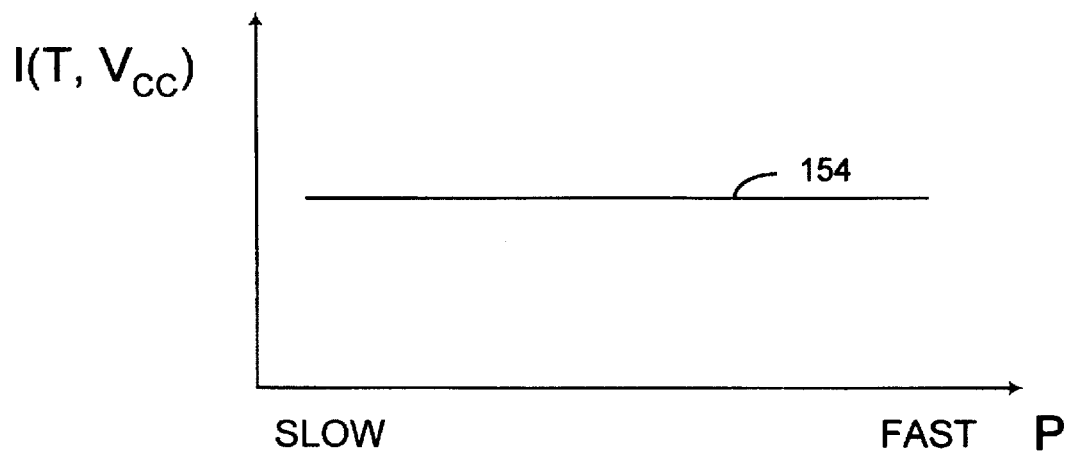
FIG. 10 is a graph illustrating the effect of the circuit shown in FIG. 9 for variations in the manufacturing process variations.

FIG. 10 is a graph of the current I(T, $V_{CC}$) versus the manufacturing process variations, designated generally by the letter P. In general the variation affects circuit speed and is characterized in general as "slow to fast". The graph illustrates that the current I(T, $V_{CC}$) 154 remains essentially constant as P varies over the 5 process corners (typical, fast-fast, slow-slow, slow-fast and fast-slow).

Figure 11:
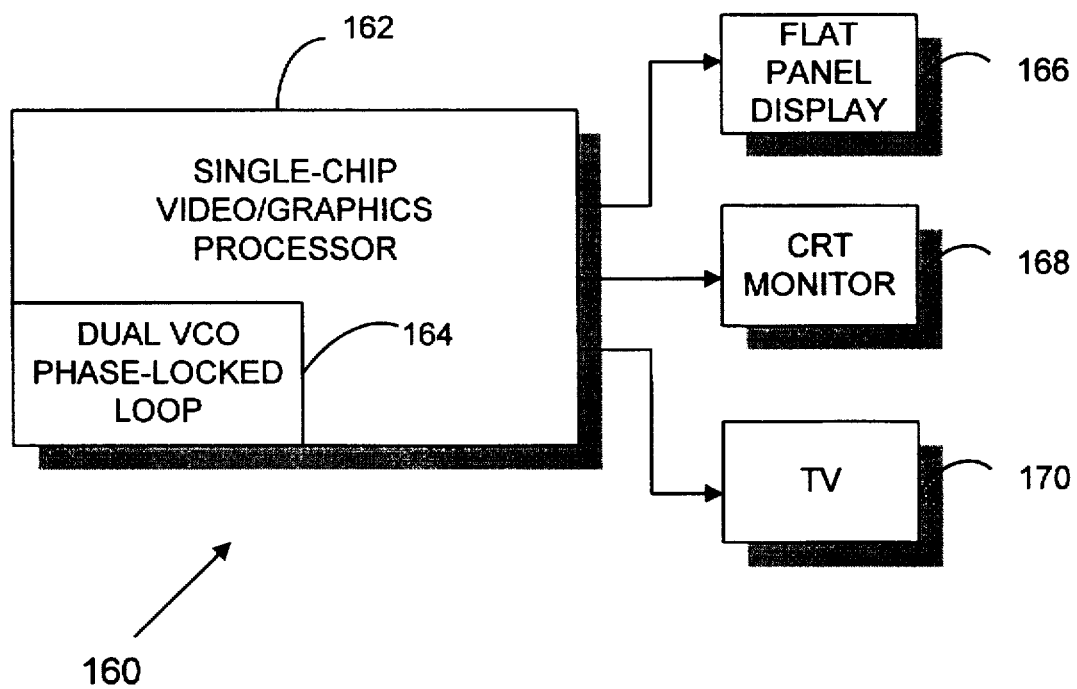
FIG. 11 is a block diagram illustrating the use of the dual VCO phase-locked loop in a single-chip video/graphics processor.

Another aspect of the invention is shown in FIG. 11, a block diagram of a multimedia display system, designated generally by the numeral 160. The display system 160 includes a single-chip video/graphics processor 162 including the dual VCO phase-locked loop 164. The display system 160 also includes a flat panel (color LCD) display 166, a color CRT monitor 168, and a color TV 170.

Different refresh clock signals are required by the single-chip video/graphics processor 162 depending upon which two display devices are active. The flat panel display 166 is either a DSTN color LCD panel or is a TFT color LCD panel. The TV 170 is either a standard US NTSC TV or is a European standard PAL TV. The display system can display simultaneously in the following configurations: (1) DSTN and CRT; (2) DSTN and NTSC; (3) DSTN and PAL; (4) TFT and CRT; (5) TFT and NTSC; and (6) TFT and PAL. For each of these combinations, the processor 162 needs two different clock signals each compatible with the refresh needs of one of the display combinations listed here. By controlling the frequency of the reference signal $f_i$ and the value of the frequency divider 1/N 72 of FIG. 2, the frequency of the two output signals $f_c$ 68 and $f_o$ 66 (FIG. 2) can be selected for compatible operation with the active display devices.

While the invention has been described in relation to the embodiments shown in the accompanying Drawing figures, other embodiments, alternatives and modifications will be apparent to those skilled in the art. It is intended that the Specification be only exemplary, and that the true scope and spirit of the invention be indicated by the following Claims.

What is claimed is:

1. A dual VCO phase-locked loop system adapted for locking to an external reference signal and having a first voltage-controlled oscillator controlled by a loop control voltage, such that an output of the first voltage-controlled oscillator is phase-locked to the external reference signal, the system including a second oscillator whose output frequency is proportional to a combination of the loop control voltage and a sum of compensating current functions permitting the second oscillator to track the frequency of the reference signal over defined operating ranges of ambient temperature, supply voltage and semiconductor manufacturing process variation.

2. The dual VCO phase-locked loop system as set forth in claim 1, wherein the compensating current functions include a current source which is independent of variations in ambient temperature and power supply voltage over the defined operating ranges, and a current sink which is independent of semiconductor manufacturing process variations over the defined operating range, and the second voltage-controlled oscillator being responsive to the combined loop control voltage, the current source, and the current sink.

3. The dual VCO phase-locked loop system as set forth in claim 1, further including a plurality of independent oscillators each controlled by the combination of the loop control voltage and the sum of compensating current functions such that the frequency of each oscillator tracks the frequency of the reference signal over the defined operating ranges.

4. A phase-locked loop, fabricated on a single integrated circuit and having two output signals, one output signal locked to an external reference signal, and the other output signal adapted for tracking the external reference signal over a defined range of variation in power supply voltage, ambient temperature and semiconductor manufacturing process, comprising:

an input line for receiving an external reference signal;

first and second output lines for providing first and second output signals;

a frequency divider having an input connected to the first output signal and having a frequency divided output;

a phase-frequency comparator having a first input connected to the external reference signal input line, and a second input connected to the frequency divider output, and having a pair of output command lines corresponding to increasing and to decreasing a frequency control voltage;

a charge pump circuit having two inputs connected to the pair of output command lines of the phase-frequency comparator, and having an output;

a loop filter having one input connected to the charge pump output and having an output for providing a loop control voltage;

a voltage-controlled oscillator having an input connected to the control voltage and an output line for providing the first output signal;

a current mirror adapted for converting the loop control voltage to a current source for providing a current proportional to the loop control voltage;

a compensating current source adapted for providing a current independent of variations in power supply voltage and ambient temperature over the defined range;

a compensating current sink adapted for providing a current independent of variations in semiconductor manufacturing process over the defined range;

a current-controlled oscillator having an input line connected to the current mirror, to the compensating current source, and the compensating current sink for controlling the frequency of an output signal as a function of the combined currents on the oscillator input line, and the current-controlled oscillator output signal being connected to the second output line, whereby the current-controlled oscillator tracks the external reference signal over the combined defined ranges of variation in power supply voltage, ambient temperature, and semiconductor manufacturing process, and shares phase-locked loop control elements thereby saving valuable integrated circuit area and operating power.

5. The phase-locked loop as set forth in claim 4, fabricated into a single chip with a multimedia controller for providing the controller with refresh clock signals for the simultaneous display on an NTSC color TV and a DSTN color LCD display.

6. The phase-locked loop as set forth in claim 4, fabricated into a single chip with a multimedia controller for providing the controller with refresh clock signals for the simultaneous display on an NTSC color TV and a TFT color LCD display.

7. The phase-locked loop as set forth in claim 4, fabricated into a single chip with a multimedia controller for providing the controller with refresh clock signals for the simultaneous display on a PAL color TV and a DSTN color LCD display.

8. The phase-locked loop as set forth in claim 4, fabricated into a single chip with a multimedia controller for providing the controller with refresh clock signals for the simultaneous display on a PAL color TV and a TFT color LCD display.

9. The phase-locked loop as set forth in claim 4, fabricated into a single chip with a multimedia controller for providing the controller with refresh clock signals for the simultaneous display on a color CRT and a DSTN color LCD display.

10. The phase-locked loop as set forth in claim 4, fabricated into a single chip with a multimedia controller for providing the controller with refresh clock signals for the simultaneous display on a color CRT and a TFT color LCD display.

* * * * *

UNITED STATES PATENT AND TRADEMARK OFFICE
CERTIFICATE OF CORRECTION

PATENT NO.   :   5,748,044
DATED        :   May 5, 1998
INVENTOR(S)  :   Yuan Xue It is certified that error appears in the above-identified patent and that said Letters Patent is hereby corrected as shown below:

In column 2 at line 61 delete "$f_c$" and insert -- $f_e$ --

In column 5 at line 15 delete "$f_c$" and insert -- $f_e$ --